United States Patent
Murashige et al.

(10) Patent No.: US 9,724,890 B2
(45) Date of Patent: Aug. 8, 2017

(54) THIN GLASS ELONGATED BODY

(71) Applicant: NITTO DENKO CORPORATION, Ibaraki-shi, Osaka (JP)

(72) Inventors: Takeshi Murashige, Ibaraki (JP); Junichi Inagaki, Ibaraki (JP); Seong Jin Ryu, Ibaraki (JP); Hiroyuki Takemoto, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/761,099

(22) PCT Filed: Jan. 16, 2014

(86) PCT No.: PCT/JP2014/050624
§ 371 (c)(1),
(2) Date: Jul. 15, 2015

(87) PCT Pub. No.: WO2014/112542
PCT Pub. Date: Jul. 24, 2014

(65) Prior Publication Data
US 2015/0343735 A1    Dec. 3, 2015

(30) Foreign Application Priority Data
Jan. 17, 2013 (JP) ................... 2013-006437

(51) Int. Cl.
*B32B 3/06* (2006.01)
*B32B 3/14* (2006.01)
(Continued)

(52) U.S. Cl.
CPC .................. *B32B 3/14* (2013.01); *B32B 7/12* (2013.01); *B32B 15/08* (2013.01); *B32B 15/20* (2013.01);
(Continued)

(58) Field of Classification Search
CPC ................ Y10T 428/197; B65H 21/00; B65H 2301/46325
(Continued)

(56) References Cited

U.S. PATENT DOCUMENTS 8,241,751 B2    8/2012  Tomamoto et al.
8,497,006 B2    7/2013  Tomamoto et al.
(Continued)

FOREIGN PATENT DOCUMENTS

EP    0 716 339 A1    6/1996
JP    1-500990 A       4/1989
(Continued)

OTHER PUBLICATIONS

International Search Report dated Mar. 4, 2014, issued in corresponding application No. PCT/JP2014/050624 (2 pages).
(Continued)

*Primary Examiner* — Alexander Thomas
(74) *Attorney, Agent, or Firm* — Westerman, Hattori, Daniels & Adrian, LLP

(57) ABSTRACT

There is provided a thin glass elongated body capable of preventing a thin glass from being broken when the thin glass elongated body is subjected to processing or treatment by a roll-to-roll process. A thin glass elongated body of the present invention includes: a main body including an elongated thin glass; and a handling section arranged at each of both ends of the main body in a length direction through intermediation of a connecting portion, the handling section including a tough film, wherein: in the connecting portion, the elongated thin glass and the tough film face each other in the length direction, and a connecting sheet is laminated on both surfaces of each of the elongated thin glass and the (Continued)

tough film; and the elongated thin glass and the tough film are connected to each other through intermediation of the connecting sheet.

14 Claims, 2 Drawing Sheets

(51) Int. Cl.
*B65G 49/06* (2006.01)
*H01L 21/67* (2006.01)
*B32B 17/06* (2006.01)
*B32B 7/12* (2006.01)
*B32B 15/08* (2006.01)
*B32B 15/20* (2006.01)
*B32B 27/06* (2006.01)
*B32B 27/28* (2006.01)
*B32B 27/34* (2006.01)
*B32B 27/36* (2006.01)

(52) U.S. Cl.
CPC ............ *B32B 17/064* (2013.01); *B32B 27/06* (2013.01); *B32B 27/281* (2013.01); *B32B 27/34* (2013.01); *B32B 27/36* (2013.01); *B32B 27/365* (2013.01); *B65G 49/06* (2013.01); *H01L 21/67132* (2013.01); *B32B 2457/12* (2013.01); *B32B 2457/20* (2013.01); *Y10T 428/197* (2015.01)

(58) Field of Classification Search
USPC .......................................................... 428/61
See application file for complete search history.

(56) References Cited

U.S. PATENT DOCUMENTS

| 8,806,894 | B2 | 8/2014 | Tomamoto et al. |
| 9,028,940 | B2* | 5/2015 | Hasegawa ............. B65H 21/00 206/413 |
| 2011/0177290 | A1 | 7/2011 | Tomamoto et al. |
| 2011/0177325 | A1 | 7/2011 | Tomamoto et al. |
| 2011/0177347 | A1 | 7/2011 | Tomamoto et al. |
| 2011/0192878 | A1 | 8/2011 | Teranishi et al. |
| 2011/0200812 | A1 | 8/2011 | Tomamoto et al. |
| 2012/0015132 | A1 | 1/2012 | Hasegawa et al. |
| 2014/0319001 | A1 | 10/2014 | Tomamoto et al. |
| 2016/0016746 | A1 | 1/2016 | Teranishi et al. |

FOREIGN PATENT DOCUMENTS

| JP | 8-283041 A | 10/1996 | |
| JP | 2007-10834 A | 1/2007 | |
| KR | 10-2011-0061517 A | 6/2011 | |
| WO | 87/06626 A1 | 11/1987 | |
| WO | 2010/038761 A1 | 4/2010 | |
| WO | 2012/008529 A1 | 1/2012 | |
| WO | WO 2012074971 A2 * | 6/2012 | ......... B65H 19/1852 |
| WO | 2012/090693 A1 | 7/2012 | |
| WO | 2012/169386 A1 | 12/2012 | |

OTHER PUBLICATIONS

Office Action dated Jul. 20, 2016, issued in counterpart Korean Patent Application No. 10-2015-7018412, with English translation. (13 pages).

* cited by examiner

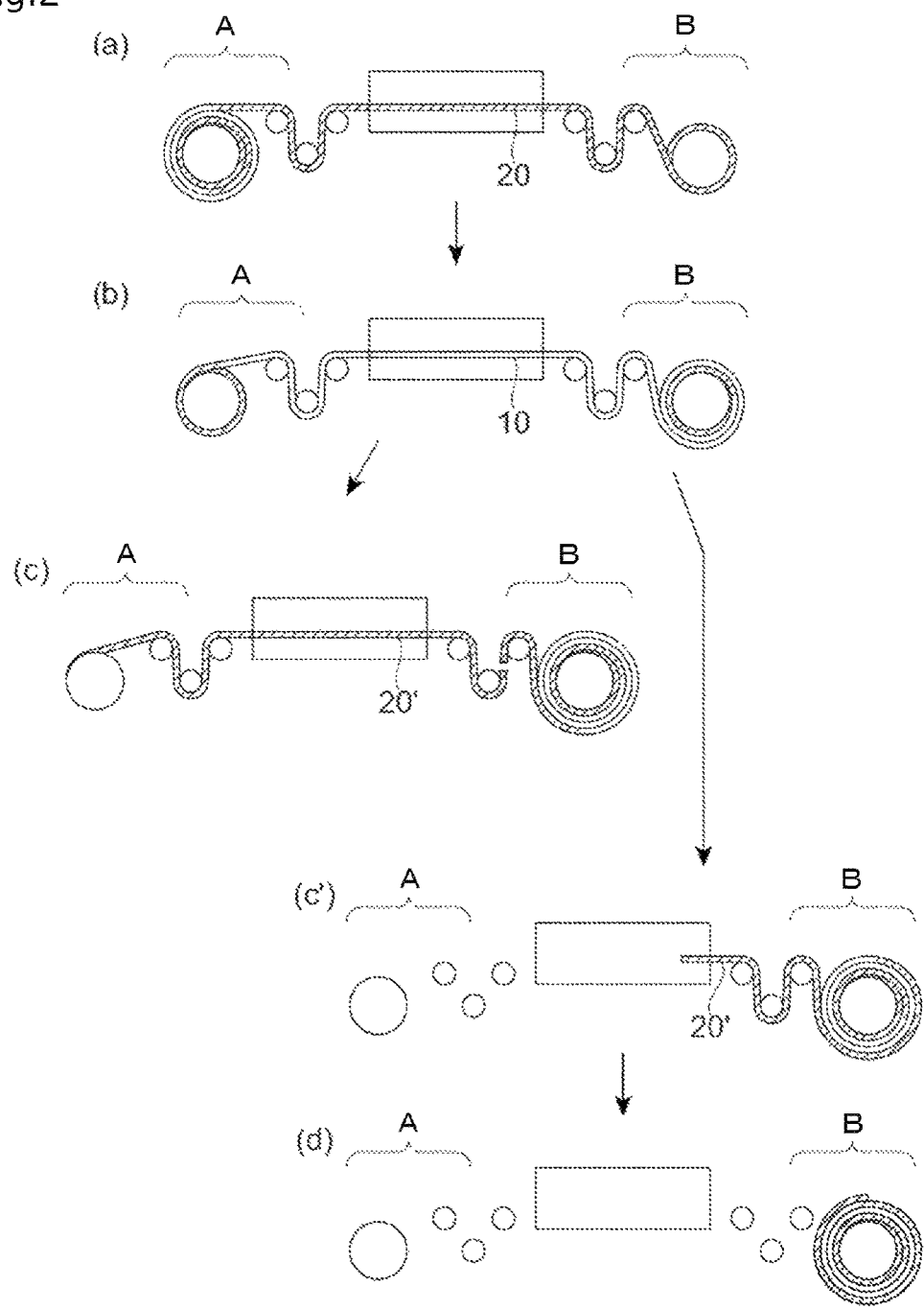

THIN GLASS ELONGATED BODY

TECHNICAL FIELD

The present invention relates to a thin glass elongated body.

BACKGROUND ART

In recent years, light-weighting and thinning of a display device, an illumination device, and a solar battery have been progressed from the viewpoint of transportation, storage, design, and the like. Further, continuous production has also been carried out to manufacture a film-shaped member to be used in those devices by a roll-to-roll process. For example, as a flexible material that may be subjected to processing or treatment by the roll-to-roll process, the use of a thin glass has been proposed (for example, Patent Literatures 1 and 2).

The thin glass is extremely fragile, resulting in a poor handling property. As a member to be used in the above-mentioned devices, for example, there has been proposed a flexible substrate enhanced in handling property by adhering a resin film onto a surface of the thin glass so as to reinforce the thin glass (for example, Patent Literature 3). However, it is extremely difficult to handle a thin glass alone as a material without breaking the thin glass throughout steps of manufacturing such a member as described above.

CITATION LIST

Patent Literature

[PTL 1] JP 01-500990 A
[PTL 2] JP 08-283041 A
[PTL 3] JP 2007-010834 A

SUMMARY OF INVENTION

Technical Problem

The present invention has been made to solve the above-mentioned problems inherent in the related art, and an object of the present invention is to provide a thin glass elongated body capable of preventing a thin glass from being broken when the thin glass elongated body is subjected to processing or treatment by a roll-to-roll process.

Solution to Problem

A thin glass elongated body of the present invention includes: a main body including an elongated thin glass; and a handling section arranged at each of both ends of the main body in a length direction through intermediation of a connecting portion, the handling section including a tough film, wherein: in the connecting portion, the elongated thin glass and the tough film face each other in the length direction, and a connecting sheet is laminated on both surfaces of each of the elongated thin glass and the tough film; and the elongated thin glass and the tough film are connected to each other through intermediation of the connecting sheet.

In one embodiment of the present invention, the elongated thin glass and the tough film face each other in the length direction at an interval in the connecting portion.

In one embodiment of the present invention, the interval between the elongated thin glass and the tough film is from 1 mm to 200 mm.

In one embodiment of the present invention, the elongated thin glass has a thickness of from 10 μm to 150 μm.

In one embodiment of the present invention, the elongated thin glass has a width of 300 mm or more.

In one embodiment of the present invention, the connecting sheet has a width of from a width of the elongated thin glass-5 mm to the width of the elongated thin glass+5 mm.

In one embodiment of the present invention, a length of a portion of the connecting sheet, in which the connecting sheet and the elongated thin glass are superimposed with each other, is from a width of the elongated thin glass×0.01 to the width of the elongated thin glass.

In one embodiment of the present invention, the connecting sheet has a thickness of from 10 μm to 150 μm.

In one embodiment of the present invention, a product of a Young's modulus and a thickness of the connecting sheet is from 50 GPa·μm to 500 GPa·μm.

In one embodiment of the present invention, the tough film has a thickness of from 5 μm to 500 μm.

In one embodiment of the present invention, a crossing angle between a central axis of the elongated thin glass in the length direction and a central axis of the tough film in the length direction is 5° or less.

Advantageous Effects of Invention

According to the embodiments of the present invention, it is possible to provide the thin glass elongated body including the tough films at both ends of the elongated thin glass in the length direction so that the thin glass is less liable to be broken when the thin glass elongated body is subjected to the processing or treatment continuously.

BRIEF DESCRIPTION OF DRAWINGS

FIGS. 2(a)-2(d) are views illustrating an example of the usage of the thin glass elongated body of the present invention.

DESCRIPTION OF EMBODIMENTS

Figure 1A:
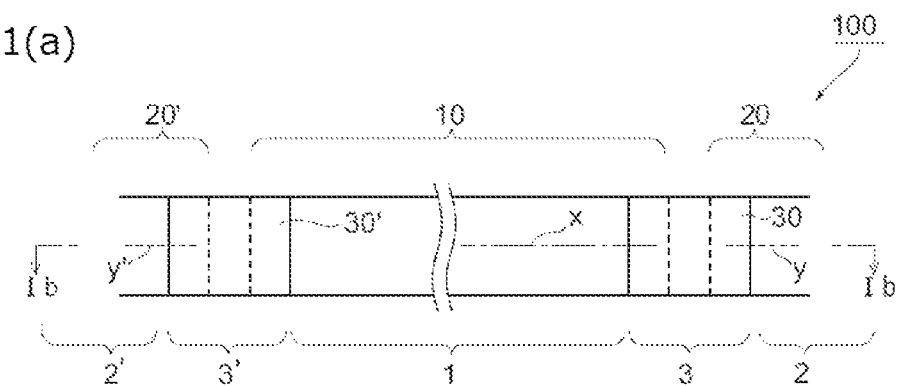
FIG. 1(a) is a schematic plan view of a thin glass elongated body according to a preferred embodiment of the present invention.
Figure 1B:
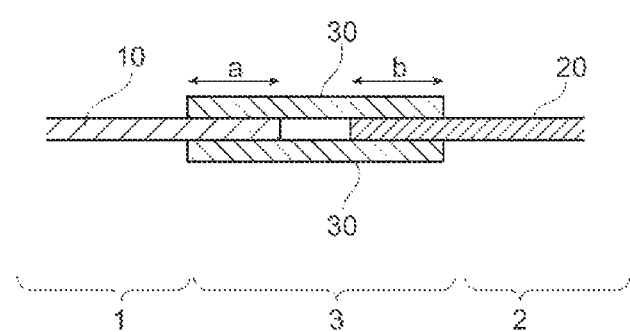
FIG. 1(b) is a schematic enlarged sectional view taken along the line Ib-Ib of FIG. 1(a).

FIG. 1(a) is a schematic plan view of a thin glass elongated body according to a preferred embodiment of the present invention. FIG. 1(b) is a schematic enlarged sectional view of the thin glass elongated body of FIG. 1(a) taken along the line Ib-Ib. A connecting portion 3 and its vicinity are illustrated in FIG. 1(b). A thin glass elongated body 100 includes a main body 1 formed of an elongated thin glass 10, and handling sections 2, 2' formed of tough films 20, 20'. The handling sections 2, 2' are arranged at respective ends of the main body 1 in a length direction through intermediation of connecting portions 3, 3'. In each of the connecting portions 3, 3', the thin glass 10 and each of the tough films 20, 20' face each other in the length direction. That is, the thin glass 10 and each of the tough films 20, 20' are arranged so as to be prevented from being superimposed with each other. In the connecting portions 3, 3', connecting sheets 30, 30' are laminated on both surfaces of each of the thin glass 10 and the tough films 20, 20'. With the connecting sheets 30, 30' laminated as described above, the thin glass 10 and each of the tough films 20, 20' are connected to each other.

In practical use, the thin glass elongated body may be provided in a state of being taken up into a roll shape. The roll-shaped thin glass elongated body is subjected to processing or treatment by a roll-to-roll process. It should be noted that the rolled thin glass elongated body as used herein is simply referred to as "roll" so as to be distinguished from processing rolls (such as a conveyance roll and a heating roll) installed in a processing/treatment device.

FIGS. 2(a)-2(d) are views illustrating an example of the usage of the thin glass elongated body of the present invention, in which steps of feeding the thin glass of the thin glass elongated body to the treatment device for the roll-to-roll process are illustrated. It should be noted that the details of the connecting portions 3, 3' are omitted in FIGS. 2(a)-2(d). FIG. 2(a) is an illustration of a stage (initiation stage) before the treatment (such as applying, sputtering, and heat treatment) of the thin glass 10 becomes a steady state. In the initiation stage, the thin glass elongated body 100 is set in the treatment device through operations involving an operation of feeding the thin glass elongated body 100 from the roll on a feed side A, an operation of causing the fed elongated body to pass through the treatment device, an operation of rolling the elongated body on a take-up side B, and the like. When the thin glass elongated body 100 of the present invention is used, an operator can perform an operation by holding the handling section (tough film 20) instead of the thin glass 10 in the initiation stage of the treatment, and hence the breakage of the thin glass 10 can be prevented. Further, the alignment can be adjusted through use of the tough film 20, and hence the breakage of the thin glass 10 caused by the adjustment can also be prevented. Further, in the case where a processing condition (for example, a processing speed) is changed when the processing and treatment shift to the steady state, a load caused by the change can be prevented from being applied to the thin glass 10.

Then, the treatment of the thin glass 10 is performed (FIG. 2(b)). After the treatment of the thin glass 10 is completed, the elongated body is cut on the take-up side B, and the roll is removed (FIG. 2(c)). In this case, the tough film can be cut instead of the thin glass when the thin glass elongated body of the present invention is used, and hence the breakage of the thin glass caused by the cutting can be prevented. After the cutting, the tough film 20' remaining on the device may be connected to a roll to be subjected to treatment subsequently. With this, the operability of the passage of the elongated body becomes satisfactory. Further, the entire thin glass elongated body 100 may be caused to pass through the treatment device without cutting the tough film (FIGS. 2(c)' and 2(d)). The thin glass elongated body of the present invention includes the tough film also at a rearmost end. Therefore, the entire elongated body can be caused to pass through the treatment device, resulting in an excellent operability and a reduction in manufacturing loss.

The thin glass elongated body of the present invention includes the handling sections formed of the tough films at both ends in the length direction, and hence, as described above, the breakage of the thin glass can be prevented in both the initiation stage and termination stage of the processing or treatment. Further, the thin glass elongated body of the present invention includes the tough films at both ends in the length direction. Therefore, after one step is completed, the roll after the completion of the step can be directly subjected to a subsequent step, resulting in an excellent operability. Also in the subsequent step, the breakage of the thin glass can be prevented in both the initiation stage and termination stage of the processing or treatment.

The thin glass elongated body of the present invention may include a tough film having the thin glasses connected to both ends thereof in the length direction. That is, the thin glass elongated body of the present invention may include a continuous portion in which a repeating unit of the handling section/the connecting portion/the main body/the connecting portion is continuously repeated in the length direction, such as the handling section/the connecting portion/the main body/the connecting portion/the handling section/the connecting portion/the main body/the connecting portion/the handling section. Also in the case where the thin glass elongated body includes the continuous portions, both the end portions of the thin glass elongated body in the length direction are formed of the handling sections. When the thin glass elongated body includes the continuous portions as described above, a plurality of the handling sections (tough films) can be cut to divide the thin glass elongated body. The number of the repeating units can be set in accordance with a desired number of segments to be divided. The number of the repeating units may be set to, for example, from 2 to 30.

<Configuration of Connecting Portion and Connecting Sheet>

As described above, in the connecting portions of the thin glass elongated body of the present invention, the thin glass 10 and each of the tough films 20, 20' are connected to each other through intermediation of the connecting sheets 30, 30' without being superimposed with each other. By virtue of such configuration, the thin glass elongated body of the present invention exhibits the following effects. Specifically, when the thin glass elongated body is taken up into a roll shape, loads applied to the thin glasses located over and under the connecting portion are reduced by virtue of a minimum difference in surface level of the connecting portion. Thus, the thin glass is prevented from being broken. In addition, at the time when the connecting portion passes through the processing roll, drastic changes in physical properties of the thin glass elongated body (that is, an influence of discontinuous physical properties between the thin glass and the tough film) can be reduced, resulting in a decrease in load applied to the thin glass. In addition, shrinkage of the tough film has no influence on the thin glass in the thin glass elongated body of the present invention, while in the case of fixing the thin glass and the tough film so as to be superimposed with each other, there is a risk in that the thin glass is broken owing to the shrinkage of the tough film. Therefore, even when the thin glass elongated body of the present invention is subjected to treatment or processing in which shrinkage occurs in the tough film (for example, heat treatment), the thin glass is prevented from being broken, and the treatment or processing can be performed stably. Further, the connecting sheet also functions as a protective film of the thin glass. The fragile end portions of the thin glass are protected by laminating the connecting sheets on both ends of the thin glass in the length direction, and the thin glass is prevented from being broken. In addition, even if the thin glass is broken in the connecting portion, scattering of the thin glass is prevented, and adhesion of a cullet onto a product is prevented.

In the connecting portions, the thin glass 10 and each of the tough films 20, 20' are connected to each other by laminating the connecting sheets 30, 30' on both surfaces of each of the thin glass 10 and the tough films 20, 20' and fixing the thin glass 10 and the tough films 20, 20'. The connecting sheet may be fixed onto the thin glass and the tough film with any appropriate pressure-sensitive adhesive or adhesive. Alternatively, the connecting sheet may be fixed onto the thin glass and the tough film with any appropriate pressure-sensitive tape or double-sided tape at both end portions of the connecting sheet in the length direction.

In the connecting portions, it is preferred that the thin glass 10 and each of the tough films 20, 20' face each other in the length direction at an interval. The interval between the thin glass and the tough film is preferably from 1 mm to 200 mm, more preferably from 5 mm to 100 mm. In general, the thin glass after being cut has a non-linear or oblique cut side in plan view, and it is difficult to precisely cut the thin glass. However, when such interval is secured between the thin glass and the tough film, the thin glass and the tough film can be connected to each other without any influence of the form of the end side of the thin glass in the length direction. Further, the end portions of the thin glass in the length direction are each prevented from being brought into contact with the tough film, and hence the thin glass can be prevented from being broken in its end portion in the length direction. More specifically, in the case where the connecting portion is bent, no external stress is applied to the thin glass from the tough film, and generation of a flaw that may induce breakage can be prevented in the end portion of the thin glass in the length direction. It should be noted that the interval between the thin glass and the tough film as used herein refers to the shortest distance between the end portion of the thin glass in the length direction and the end portion of the tough film in the length direction facing the end portion of the thin glass in the length direction.

The length of the connecting sheet is preferably from the width of the thin glass×0.02 to the width of the thin glass×3, more preferably from the width of the thin glass×0.2 to the width of the thin glass×2, still more preferably from the width of the thin glass×0.2 to the width of the thin glass×1.5. When the length of the connecting sheet falls within the above-mentioned range, the connection between the thin glass and the tough film can be prevented from being lost. In addition, the influence of discontinuous physical properties between the thin glass and the tough film is mitigated, and hence the thin glass elongated body capable of preventing breakage of the thin glass at the time of passing through the processing roll can be obtained. In one embodiment, the length of the connecting sheet is preferably from 30 mm to 3,700 mm, more preferably from 120 mm to 2,500 mm, still more preferably from 120 mm to 1,900 mm, particularly preferably from 120 mm to 1,000 mm. It should be noted that two connecting sheets laminated on both surfaces of each of the thin glass and the tough film may have the same length or different lengths. The two connecting sheets preferably have the same length. The two connecting sheets are more preferably laminated without positional misalignment between a front surface and a back surface.

The length a of a portion of the connecting sheet 30, in which the connecting sheet 30 and the thin glass 10 are superimposed with each other, is preferably from the width of the thin glass×0.01 to the width of the thin glass, more preferably from the width of the thin glass×0.1 to the width of the thin glass, still more preferably from the width of the thin glass×0.2 to the width of the thin glass×0.8. When the length a falls within the above-mentioned range, the connection between the thin glass and the tough film can be prevented from being lost, and the thin glass elongated body capable of preventing breakage of the thin glass can be obtained. In one embodiment, the length of the portion of the connecting sheet, in which the connecting sheet and the thin glass are superimposed with each other, is preferably from 15 mm to 1,200 mm, more preferably from 60 mm to 1,000 mm, still more preferably from 60 mm to 500 mm.

The length b of a portion of the connecting sheet 30, in which the connecting sheet 30 and the tough film 20 are superimposed with each other, is preferably from the width of the thin glass×0.01 to the width of the thin glass×2, more preferably from the width of the thin glass×0.05 to the width of the thin glass×1.5, still more preferably from the width of the thin glass×0.15 to the width of the thin glass. In one embodiment, the length of the portion of the connecting sheet, in which the connecting sheet and the tough film are superimposed with each other, is preferably from 10 mm to 2,400 mm, more preferably from 30 mm to 1,200 mm, still more preferably from 60 mm to 600 mm.

The crossing angle between the central axis x of the thin glass 10 in the length direction and each of the central axes y, y' of the tough films 20, 20' in the length direction is preferably 5° or less, more preferably 3° or less, still more preferably 1° or less, particularly preferably 0° as in the illustrated example. In the case where the crossing angle is more than 5°, there is a risk in that the thin glass travels with a lack of rectilinearity in its treatment or processing by the roll-to-roll process, resulting in a decrease in processing precision. In addition, misalignment and wrinkles are liable to occur in a take-up operation, and the thin glass may be broken owing to the misalignment and wrinkles.

As a material for forming the connecting sheet, any appropriate material may be selected as long as the effect of the present invention is obtained. Examples of the material for forming the connecting sheet include a resin and a metal. Examples of the resin include a polyethylene terephthalate-based resin, a polyimide-based resin, a polyamide-based resin, a polyethylene naphthalate-based resin, a polycarbonate-based resin, and a cycloolefin-based resin. Of those, a polyethylene terephthalate-based resin is preferably used. Examples of the metal include aluminum, stainless steel, copper, iron, and lead. Of those, aluminum or stainless steel is preferably used. The two connecting sheets laminated on both surfaces of each of the thin glass and the tough film may be formed of the same material or different materials. It is preferred that the two connecting sheets be formed of the same material and have the same thickness. With this, warpage is reduced in the connecting portion, and the thin glass can be prevented from being broken.

The thickness of the connecting sheet is preferably from 10 μm to 150 μm, more preferably from 15 μm to 100 μm, still more preferably from 15 μm to 50 μm, particularly preferably from 15 μm to 25 μm. When the thickness of the connecting sheet falls within the above-mentioned range, the thin glass elongated body to be obtained can exhibit a high protective effect on the thin glass and have a small difference in surface level in the connecting portion.

A product of the Young's modulus and the thickness of the connecting sheet is preferably from 50 GPa·μm to 500 GPa·μm, more preferably from 50 GPa·μm to 300 GPa·μm. That is, in the case of using a thick connecting sheet, it is preferred to select a material having a low Young's modulus as compared to the case of using a thin connecting sheet. With this, the thin glass elongated body having a high protective effect on the thin glass can be obtained. The Young's modulus as used herein refers to a value calculated from a maximum tangent gradient in a stress-strain (S-S) curve obtained by stretching a strip sample having a width of 10 mm at 23° C., a chuck distance of 50 mm, and a speed of 300 mm/min.

It is preferred that the product of the Young's modulus and the thickness of the connecting sheet be smaller than a product of the Young's modulus and the thickness of the thin glass. The product (GPa·μm) of the Young's modulus and the thickness of the connecting sheet is preferably 90% or less, more preferably 80% or less, still more preferably 70% or less, particularly preferably 60% or less, most preferably 50% or less, with respect to the product (GPa·μm) of the Young's modulus and the thickness of the thin glass. Such connecting sheet is preferred because a load due to bending is less liable to be applied onto the connecting sheet than onto the thin glass. In addition, by using such a connecting sheet which is more flexible than the thin glass, sufficient flexibility is exhibited in the connecting portion, and the thin glass can be prevented from being broken in the connecting portion.

The width of the connecting sheet is preferably from the width of the thin glass-5 mm to the width of the thin glass+5 mm, more preferably from the width of the thin glass-2 mm to the width of the thin glass+2 mm, still more preferably substantially the same as the width of the thin glass.

<Thin Glass>

As the thin glass, any appropriate thin glass may be adopted as long as the thin glass has a plate shape. As the thin glass, according to the classification based on a composition, there are given, for example, soda-lime glass, borate glass, aluminosilicate glass, quartz glass, and the like. Further, according to the classification based on an alkaline component, there are given alkali-free glass and low-alkali glass. Preferably, the alkali-free glass is used. This is because the alkali-free glass is excellent in strength and chemical durability. In the case where the thin glass elongated body includes a plurality of thin glasses, the plurality of thin glasses may be those belonging to the same classification or those belonging to different classifications.

As a method of forming the thin glass, any appropriate method may be adopted. Typically, the thin glass is manufactured by melting a mixture containing main raw materials such as silica and alumina, an antifoaming agent such as a salt cake and antimony oxide, and a reducing agent such as carbon at temperature of from 1,400° C. to 1,600° C. so as to form the mixture into a thin plate shape, and cooling the resultant. As a method of forming the thin glass into a thin plate, there are given, for example, a slot down-draw method, a fusion method, a float method, and the like. The thin glass formed into a plate shape by those methods may be reduced in thickness or subjected to chemical polishing with a solvent such as hydrofluoric acid, as necessary, in order to increase the smoothness of a surface and an end portion.

The thickness of the thin glass is preferably from 10 μm to 150 μm, more preferably 20 μm to 120 μm, still more preferably 30 μm to 100 μm. In the case where the thickness of the thin glass is more than 150 μm, the thin glass does not have sufficient flexibility, and there is a risk in that the thin glass may be difficult to take up into a roll shape. Further, in the case where the thickness of the thin glass is less than 10 μm, there is a risk in that the handling may be difficult. In the case where the thin glass elongated body includes a plurality of thin glasses, the dimensions (thickness, length) of the plurality of thin glasses may be the same or different.

The width of the thin glass is preferably 300 mm or more, more preferably 400 mm or more. In general, a wide thin glass is difficult to handle because a significant load is applied to the thin glass when the thin glass is twisted or deflected under the self weight. The present invention exhibits the effect markedly in the processing or treatment of the wide thin glass, which is usually difficult to handle. The upper limit of the width of the thin glass is preferably 2,000 mm or less, more preferably 1,500 mm or less, still more preferably 1,200 mm or less.

The length of the thin glass may be set to any appropriate length in accordance with a desired treatment or processing amount. For example, the thin glass having a length of from 30 m to 1,000 m may be used.

A surface of the thin glass may be protected with a resin film or the like. As long as the surface is protected, even in the case where the thin glass ruptures during conveyance, the operation of the device can be continued without suspending the conveyance of the thin glass elongated body.

<Tough Film>

As a material for forming the tough film, any appropriate material may be selected as long as the effect of the present invention is obtained. As the material for forming the tough film, a material having higher toughness than that of the thin glass is used, and examples thereof include a resin and a metal. Examples of the resin include a polyethylene terephthalate-based resin, a polyimide-based resin, a polyamide-based resin, a polyethylene naphthalate-based resin, a polycarbonate-based resin, and a cycloolefin-based resin. Of those, a polyethylene terephthalate-based resin is preferably used. Examples of the metal include aluminum, stainless steel, copper, iron, and lead. Of those, aluminum or stainless steel is preferably used. The thin glass elongated body of the present invention includes a plurality of tough films, and the plurality of tough films may be formed of the same material or different materials.

A fracture toughness value of the tough film is preferably from 2 MPa·m$^{1/2}$ to 20 MPa·m$^{1/2}$, more preferably from 5 MPa·m$^{1/2}$ to 20 MPa·m$^{1/2}$, particularly preferably from 10 MPa·m$^{1/2}$ to 20 MPa·m$^{1/2}$.

The thickness of the tough film is preferably from 5 μm to 500 μm. When the tough film is formed of the resin, the thickness of the tough film is preferably from 10 μm to 200 μm, more preferably from 30 μm to 100 μm. When the tough film is formed of the metal, the thickness of the tough film is more preferably from 5 μm to 200 μm, still more preferably from 10 μm to 100 μm, particularly preferably from 30 μm to 50 μm. The tough film having a thickness within the above-mentioned range is excellent in a handling property due to the weight and is easily cut. In addition, the formation of wrinkles and the rupture can be prevented. Therefore, the tough film having a thickness within the above-mentioned range is preferred as the tough film for the thin glass elongated body of the present invention. The dimensions (thickness, length) of the plurality of tough films may be the same or different.

It is preferred that the material and thickness of the tough film be selected so that the bending stress of a surface (convex side) of the tough film caused when the thin glass elongated body is taken up is smaller than that of a surface (convex side) of the thin glass. More specifically, it is preferred that a product of the Young's modulus and the thickness of the tough film be smaller than that of the Young's modulus and the thickness of the thin glass. The product (GPa~μm) of the Young's modulus and the thickness of the tough film is preferably 90% or less, more preferably 80% or less, still more preferably 70% or less, particularly preferably 60% or less, most preferably 50% or less, with respect to the product (GPa·μm) of the Young's modulus and the thickness of the thin glass. The tough film described above is preferred because a load caused by bending is less liable to be applied to the tough film than in the case of the thin glass. Further, when the tough film that is bent more easily than the thin glass is used, sufficient flexibility is exhibited also in a connecting portion, and the breakage of the thin glass in the connecting portion can be prevented.

The width of the tough film is preferably from 300 mm to 2,000 mm, more preferably from 300 mm to 1,500 mm, still more preferably from 400 mm to 1,200 mm. The absolute value of the difference between the width of the thin glass and the width of the tough film is preferably 20 mm or less, more preferably 10 mm or less, still more preferably 5 mm or less, particularly preferably 1 mm or less, most preferably 0 mm. As the absolute value of the difference between the width of the thin glass and the width of the tough film is smaller, the alignment is more easily adjusted at the time of the processing or treatment.

The coefficient of linear expansion of the tough film in a width direction is preferably 50 ppm or less, more preferably from 10 ppm to 30 ppm. Further, the coefficient of linear expansion of the tough film in the width direction is preferably one time to ten times, more preferably two times to ten times as large as the coefficient of linear expansion of the thin glass. As long as the coefficient of linear expansion of the tough film in the width direction falls within the above-mentioned range, even in the case where the thin glass elongated body is subjected to the heat treatment step, the absolute value of the difference between the width of the thin glass and the width of the tough film can be maintained to be small, and the alignment is more easily adjusted at the time of the processing or treatment.

The coefficient of linear expansion of the tough film in a length direction is preferably 50 ppm or less, more preferably from 10 ppm to 30 ppm. As long as the coefficient of linear expansion of the tough film in the length direction falls within the above-mentioned range, even in the case where the thin glass elongated body is subjected to the heat treatment step, the peeling of the connecting sheets can be prevented.

The coefficient of thermal shrinkage of the tough film in the width direction when heated at 150° C. for 30 minutes is preferably 10% or less, more preferably 5% or less, still more preferably 1% or less. As long as the coefficient of thermal shrinkage of the tough film falls within the above-mentioned range, even in the case where the thin glass elongated body is subjected to the heat treatment step, the absolute value of the difference between the width of the thin glass and the width of the tough film can be maintained to be small, and the alignment is more easily adjusted at the time of the processing or treatment.

The coefficient of thermal shrinkage of the tough film in the length direction when heated at 150° C. for 30 minutes is preferably 10% or less, more preferably 5% or less, still more preferably 1% or less. As long as the coefficient of thermal shrinkage of the tough film falls within the above-mentioned range, even in the case where the thin glass elongated body is subjected to the heat treatment step, the peeling of the connecting sheets can be prevented.

The tough film having a small coefficient of linear expansion and/or coefficient of thermal shrinkage as described above can be obtained, for example, by using a resin subjected to stretching treatment as a forming material. For example, in the case of using a PET film as the tough film, a film stretched by two times to twenty times in a transverse direction (TD) and by two times to twenty times in a machine direction (MD) is preferred as the PET film.

It is preferred that the length of the tough film be equal to or more than the length (length from feed to take-up) of the device in which the thin glass elongated body is set. When the length of the tough film is equal to or more than the length of the device, a thin glass elongated body excellent in operability in the initiation stage and termination stage of the processing or treatment can be obtained. The length of the tough film is, for example, from 5 m to 200 m.

INDUSTRIAL APPLICABILITY

The thin glass elongated body of the present invention can be suitably used as a thin glass material to be subjected to the roll-to-roll process, such as a display substrate, a sensor cover, or an element cover.

REFERENCE SIGNS LIST

10 thin glass
20, 20' tough film
30, 30' connecting sheet
100 thin glass elongated body

The invention claimed is:

1. A glass elongated body, comprising:
a main body comprising an elongated glass; and
a handling section arranged at each of both ends of the main body, in a length direction, through intermediation of a connecting portion, the handling section comprising a film,
wherein, in the connecting portion, the elongated glass and the film face each other in the length direction, and a connecting sheet is laminated on both surfaces of each of the elongated glass and the film;
wherein the elongated glass and the film are connected to each other through intermediation of the connecting sheet,
wherein the connecting sheet has a width of from a width of the elongated glass minus 5 mm to the width of the elongated glass plus 5 mm, and
wherein a product of a Young's modulus and a thickness of the connecting sheet is 90% or less with respect to a product of a Young's modulus and a thickness of the elongated glass.

2. The glass elongated body according to claim 1,
wherein, in the connecting portion, the elongated glass and the film face each other in the length direction at an interval.

3. The glass elongated body according to claim 2,
wherein the interval between the elongated glass and the film is from 1 mm to 200 mm.

4. The glass elongated body according to claim 1, wherein the thickness of the elongated glass is from 10 μm to 150 μm.

5. The glass elongated body according to claim 1, wherein the elongated glass has a width of 300 mm or more.

6. The glass elongated body according to claim 1,
wherein a length of a portion of the connecting sheet in which the connecting sheet and the elongated glass are superimposed with each other is from a width of the elongated glass times 0.01 to the width of the elongated glass.

7. The glass elongated body according to claim 1,
wherein the thickness of the connecting sheet is from 10 μm to 150 μm.

8. The glass elongated body according to claim 1,
wherein the product of the Young's modulus and the thickness of the connecting sheet is from 50 GPa·μm to 500 GPa·μm.

9. The glass elongated body according to claim 1,
wherein the film has a thickness of from 5 μm to 500 μm.

10. The glass elongated body according to claim 1,
wherein a crossing angle between a central axis of the elongated glass, in the length direction, and a central axis of the film, in the length direction, is 5° or less.

11. The glass elongated body according to claim 1, wherein the product of the Young's modulus and the thickness of the connecting sheet is 80% or less with respect to the product of the Young's modulus and the thickness of the elongated glass.

12. The glass elongated body according to claim 1, wherein the product of the Young's modulus and the thickness of the connecting sheet is 70% or less with respect to the product of the Young's modulus and the thickness of the elongated glass.

13. The glass elongated body according to claim 1, wherein the product of the Young's modulus and the thickness of the connecting sheet is 60% or less with respect to the product of the Young's modulus and the thickness of the elongated glass.

14. The glass elongated body according to claim 1, wherein the product of the Young's modulus and the thickness of the connecting sheet is 50% or less with respect to the product of the Young's modulus and the thickness of the elongated glass.

* * * * *